US006054939A

United States Patent [19]

Wei et al.

[11] Patent Number: 6,054,939

[45] Date of Patent: Apr. 25, 2000

[54] KEYBOARD ASSEMBLY

[75] Inventors: Yu-Feng Wei, Taipei Hsien; Chein-Shih Hsu, Taipei, both of Taiwan

[73] Assignee: Acer Peripherals, Inc., Taiwan

[21] Appl. No.: 09/038,275

[22] Filed: Mar. 11, 1998

[30] Foreign Application Priority Data

Oct. 24, 1997 [TW] Taiwan ................................ 86218074

[51] Int. Cl.[7] .................................................... H03M 11/00

[52] U.S. Cl. ............................ 341/20; 400/472; 200/513

[58] Field of Search .................... 341/20, 22; 200/302.1, 200/512, 513, 5 A; 362/680; 400/472

[56] References Cited

U.S. PATENT DOCUMENTS

| | | | |
|---|---|---|---|
| 4,604,509 | 8/1986 | Clancy | 200/513 |
| 4,611,261 | 9/1986 | Suwa | 361/680 |
| 4,677,268 | 6/1987 | Nemeth et al. | 200/513 |
| 4,839,474 | 6/1989 | Hayes-Panhurst | 200/5 A |
| 4,952,761 | 8/1990 | Viebrantz | 200/513 |
| 5,212,356 | 5/1993 | English | 200/5 A |
| 5,421,659 | 6/1995 | Liang | 400/472 |

*Primary Examiner*—Brian Zimmerman
*Assistant Examiner*—Albert K. Wong
*Attorney, Agent, or Firm*—Pillsbury Madison & Sutro LLP

[57] ABSTRACT

A keyboard assembly capable of protecting the circuit membrane or other internal circuitry in the keyboard from being damaged by water flowing in from the key seats and from the bolt holes.

The keyboard assembly of the invention utilizes a water-resistant sheet, which covers the circuit membrane mounted on the base of the keyboard body and is surrounded by a sealing flange.

18 Claims, 7 Drawing Sheets

KEYBOARD ASSEMBLY

FIELD OF THE INVENTION

The present invention relates to a keyboard and in particular to a keyboard assembly including a water-resistant sheet covering the circuit membrane to protect the keyboard from being damaged by water.

DESCRIPTION OF THE PRIOR ART

U.S. Pat. No. 5,421,659 issued to Liang discloses a keyboard assembly that is water-proof. Referring to FIG. 1, the keyboard assembly includes a keyboard body which includes a number of depressions 48 formed in the upper case 16 for collecting water, and a number of seats 11 extending upward for slidably receiving press keys (not shown). A number of water passages 12 are thus formed between adjacent seats 11 within the depressions 48. A base 14 is secured to the keyboard upper case 16 by fastening means such as bolts, and a casing 15 is secured to the bottom of the base 14. The keyboard assembly features having a number of conduits 13 extending downward from the depressions 48 for communicating the depressions 48 with the casing 15 to allow water collected in the depressions 48 to flow into the casing 15 so as to prevent water from flowing into the circuit membrane 30 mounted between the keyboard upper case 16 and the base 14.

However, such a structure can not prevent water from entering the keyboard from the seats 11 or from the bolt holes for mounting the bolts to fasten the base 14 and the keyboard body 16. And thus the circuit membrane 30 and the internal circuitry 24 may be easily damaged when water is inadvertently splashed onto the keyboard.

SUMMARY OF THE INVENTION

It is therefore an object of the invention to provide a keyboard assembly capable of protecting the circuit membrane or other internal circuitry in the keyboard from being damaged by water flowing in from the key seats and from the bolt holes.

In order to attain the above object, the keyboard assembly of the invention utilizes a water-resistant sheet which covers the circuit membrane mounted on the base of the keyboard body and is surrounded by a sealing flange. A key frame having a plurality of key seats is disposed above the water-resistant sheet so that a space for collecting water is formed therebetween. A plurality of conduits extending downward from the space are provided for draining water collected in the space. The base, the circuit membrane and the water-resistant sheet are secured to the key frame by a plurality of screw bolts received respectively in a plurality of bolt holes formed through the base, the circuit membrane and the water-resistant sheet. A sealing flange also surrounds the bolt holes.

According to an aspect of the invention, using the existing rubber-dome sheet as a water-resistant sheet, the water-resistant sheet includes a plurality of elastic protruding portions. The elastic protruding portions can be integrally formed by elastomer material with the water-resistant sheet and are respectively disposed corresponding to the switch elements of the circuit membrane so that when the elastic portions are depressed by the keys, the corresponding switch elements are activated.

According to another aspect of the invention, the sealing flange is integrally formed with the water-resistant sheet by an elastomer material and the thickness of the sealing frame is greater than the thickness of the water-resistant sheet.

According to a further aspect of the invention, the keyboard assembly further includes an upper case mounted on the base. The upper case includes a protruding portion disposed downwardly along the sealing flange in a manner when the upper case is secured to the base, the protruding portion urges the water-resistant sheet along the sealing flange.

BRIEF DESCRIPTION OF THE DRAWINGS

The preferred embodiment of the invention is hereinafter described with reference to the accompanying drawings in which.

DETAILED DESCRIPTION OF THE PREFERRED EMBODIMENT

Figure 1:
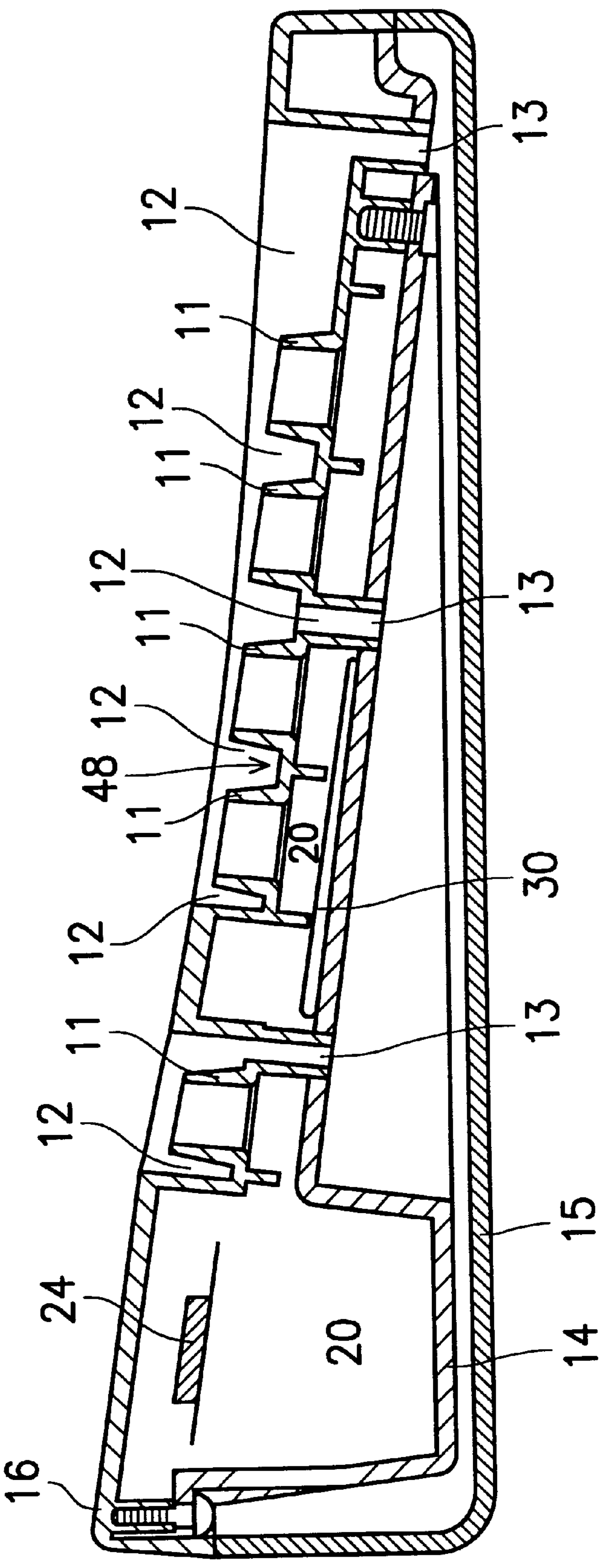
FIG. 1 (PRIOR ART)
FIG. 1 is a cross-section view of the waterproof keyboard assembly of U.S. Pat. No. 5,421,659.
Figure 2A:
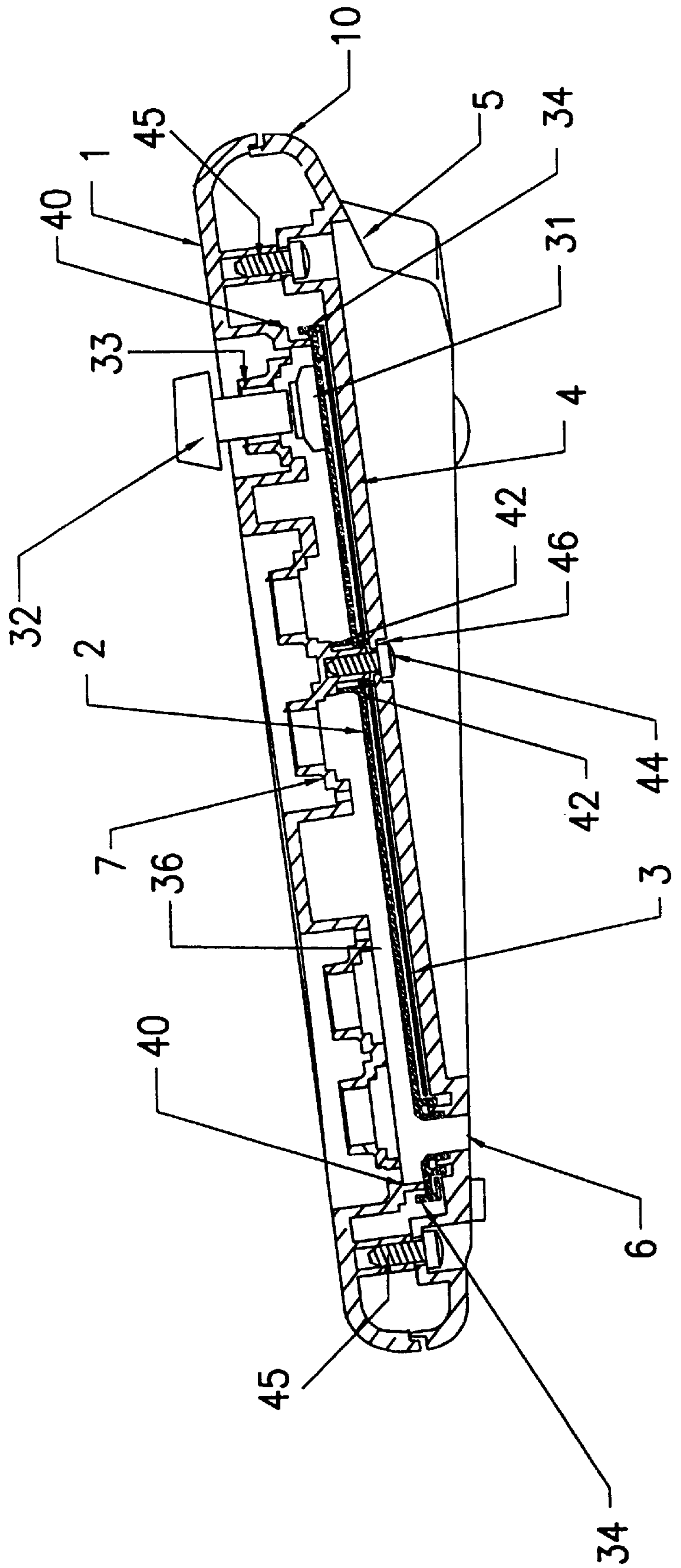
FIG. 2*a* is a cross-section view of the keyboard assembly of a preferred embodiment of the invention.

Referring to FIG. 2*a*, the key assembly 10 of this embodiment includes a base 5, a key frame 7 and an upper case 1. The base 5 has a supporting surface 4 on which a circuit membrane 3 is mounted. The circuit membrane 3 has a number of switch elements (not shown) for actuation by pressure. A water-resistant sheet 2 covers the circuit membrane 3. The water-resistant sheet 2 is made of rubber and is provided with a number of inverse-cup shaped elastic portions 31. Each of the inverse-cup shaped elastic portions 31 is integrally formed with the water-resistant sheet 2 by rubber material and is disposed corresponding to one switch element. The key frame 7 is disposed above the water-resistant sheet 2 and has a number of key seats 33. Each key seat 33 is extended upwardly from the corresponding inverse-cup shaped elastic portion 31 for slidably receiving the key 32. In this manner, when the key 32 is pressed down, the corresponding inverse-cup shaped elastic portion 31 is depressed to activate the corresponding switch element. When the key 32 is released, it bounces back to its original position by the upward pushing force of the corresponding inverse-cup shaped elastic portion 31. The upper case 1 is secured to the base 5 by a number of bolts 45. The key frame 7 is secured to the base 5 by a number of bolts 44 received in bolt holes 46 formed through the base 5, the circuit membrane 3 and the water-resistant sheet 2. Note that a space 36 is formed between the key frame 7 and the water-resistant sheet 2.

A sealing flange 34 is disposed surrounding the water-resistant sheet 2 and is integrally formed with the water-resistant sheet 2 by rubber material. The sealing flange 34 has a thickness greater than that of the water-resistant sheet 2 so that when the upper case 1 is secured to the base 5, the sealing flange 34 will tighten the water-resistant sheet 2 to ensure a water-tight effect. This mechanism will be described in detail with reference to FIG. 2b hereinafter.

A number of conduits 6 are extended downward from the space 36, for draining water that has entered from the bolt holes 46 or the key seats 33.

Figure 2B:
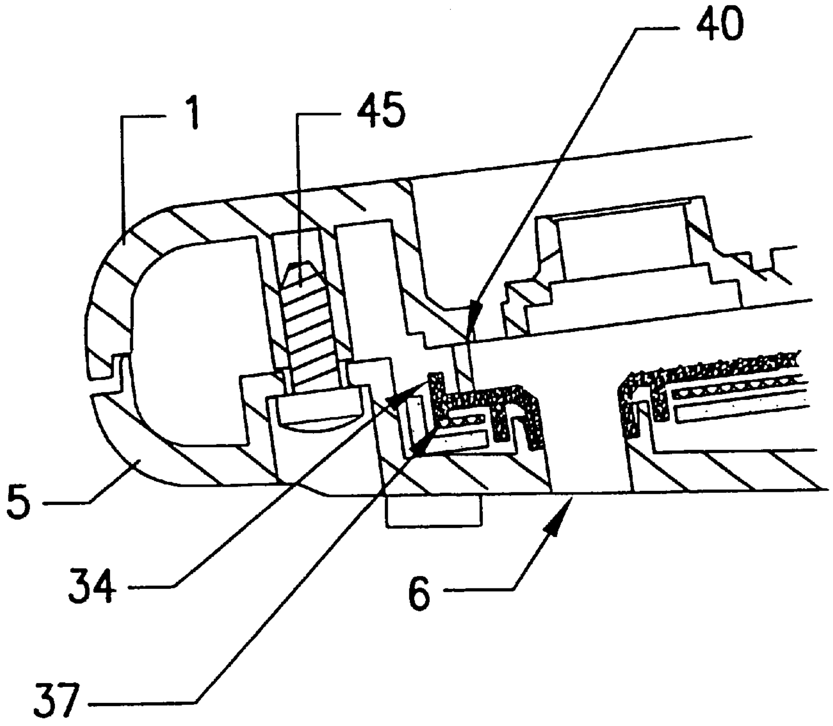
FIG. 2*b* is an enlarged sectional view showing the conduit and the protruding portion of the upper case and the second sealing flange surrounding the conduit.
Figure 2C:
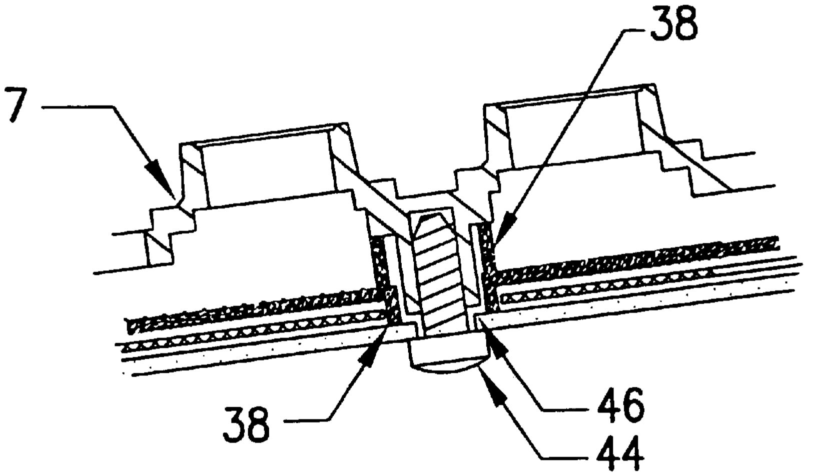
FIG. 2*c* is an enlarged sectional view showing the screw bolt and the third sealing flange surrounding the screw holes for receiving the screw holes.

Moreover, to further improve the watertight effect, sealing flanges 37 and 38 are also respectively formed around the conduits 6 and the bolt holes 46, as shown in FIGS. 2b and 2c. The sealing flanges 37 and 38 are also integrally formed with the water-resistant sheet 2 by rubber material.

Referring to FIG. 2b again, a protruding portion 40 is disposed downwardly along the sealing flange 34 such that when the upper case 1 is secured to the base 5 by the bolts 45, the protruding portion 40 is urged to the water-resistant sheet 2 along the sealing flange 34 to ensure the water-tightness of the sealing flange 34.

Figure 3A:
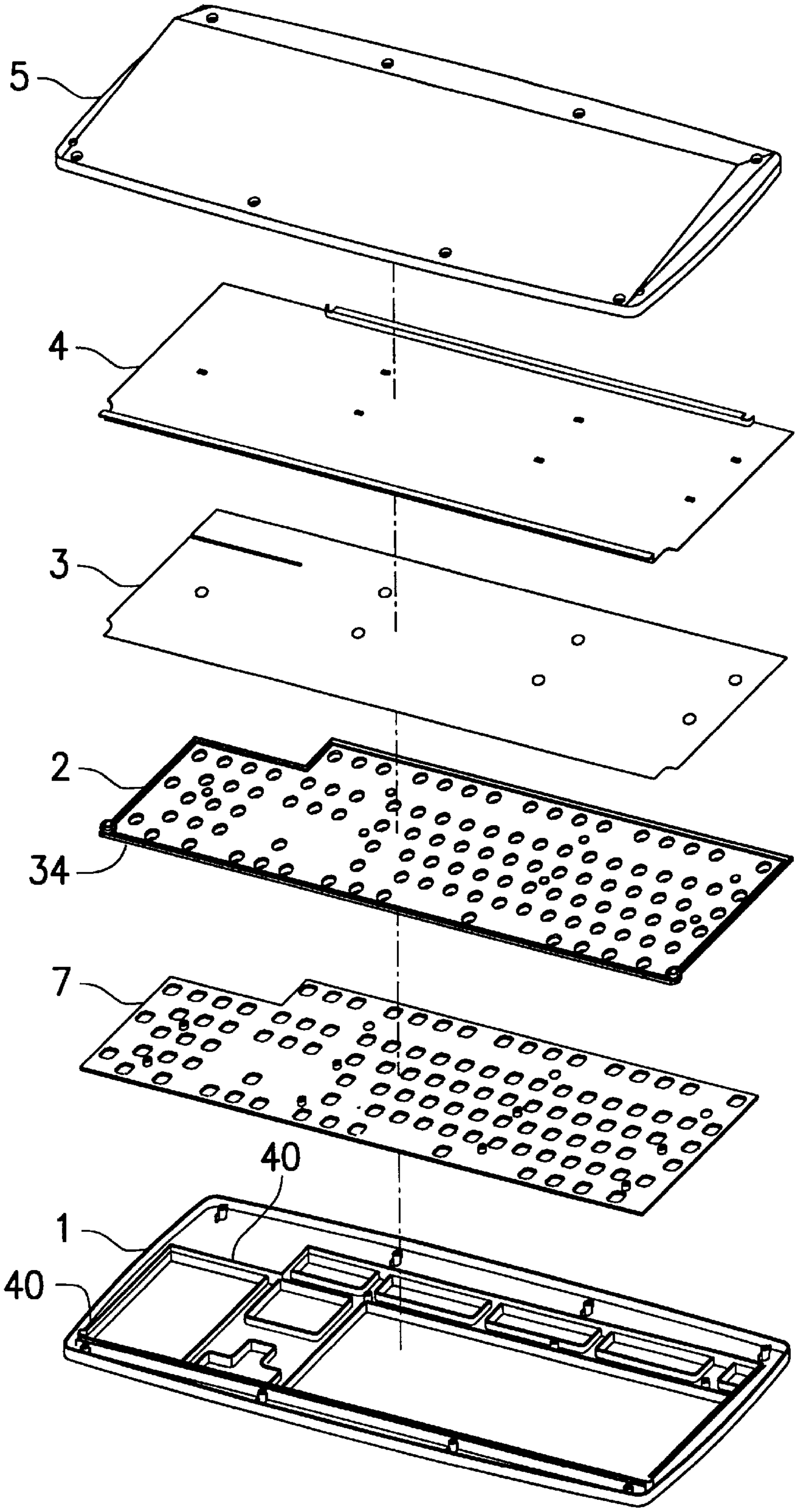
FIG. 3*a* is an exploded view of a preferred embodiment of the keyboard assembly of the invention, which is viewed from the bottom.
Figure 3B:
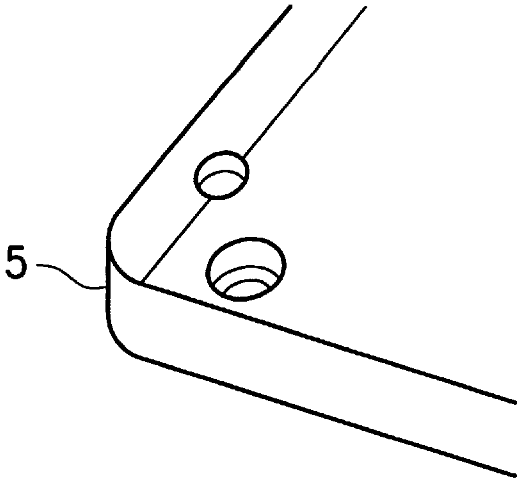
FIGS. 3*b*–3*d* are schematic views showing the structure surrounding the conduit and the assembly of the conduit.
Figure 3C:
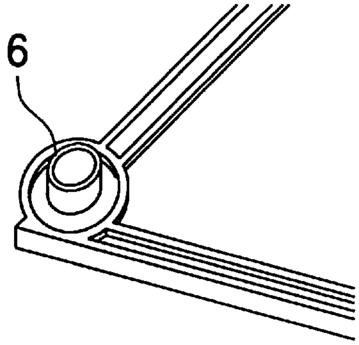
Figure 3D:
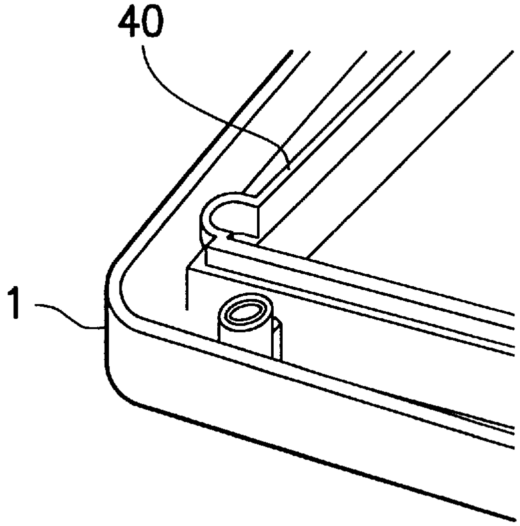

Referring to FIG. 3a, an exploded view of the keyboard assembly of FIG. 2a is shown. This diagram is viewed from the bottom to more clearly demonstrate the structure of the keyboard assembly of the invention. Basically, the base 5 can be integrally formed by elastomer material with the supporting base 4; and the key frame 7 can be integrally formed by elastomer material with the upper case 1. FIGS. 3b–3d are schematic views showing the conduit 6, the protruding portion 40 and the assembly of the two. These diagrams are also viewed from the bottom to more clearly demonstrate the structure.

Figure 4A:
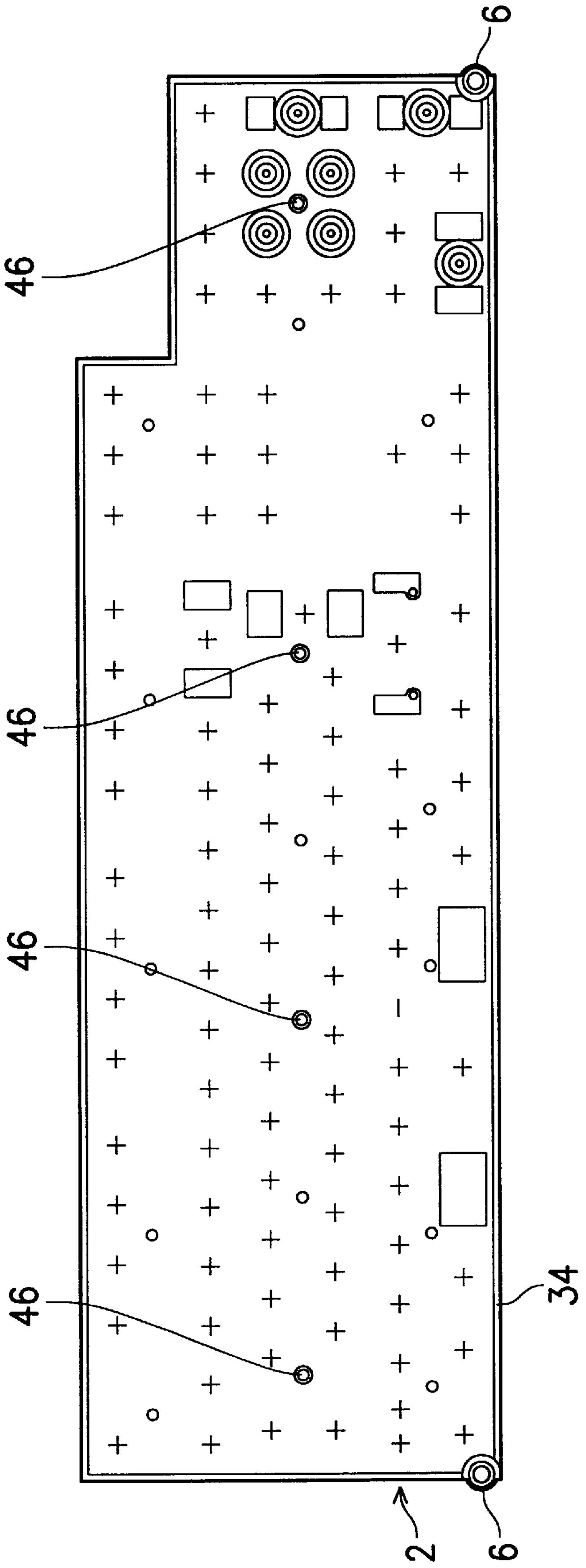
FIG. 4*a* is a top view of the water-resistant sheet.
Figure 4B:
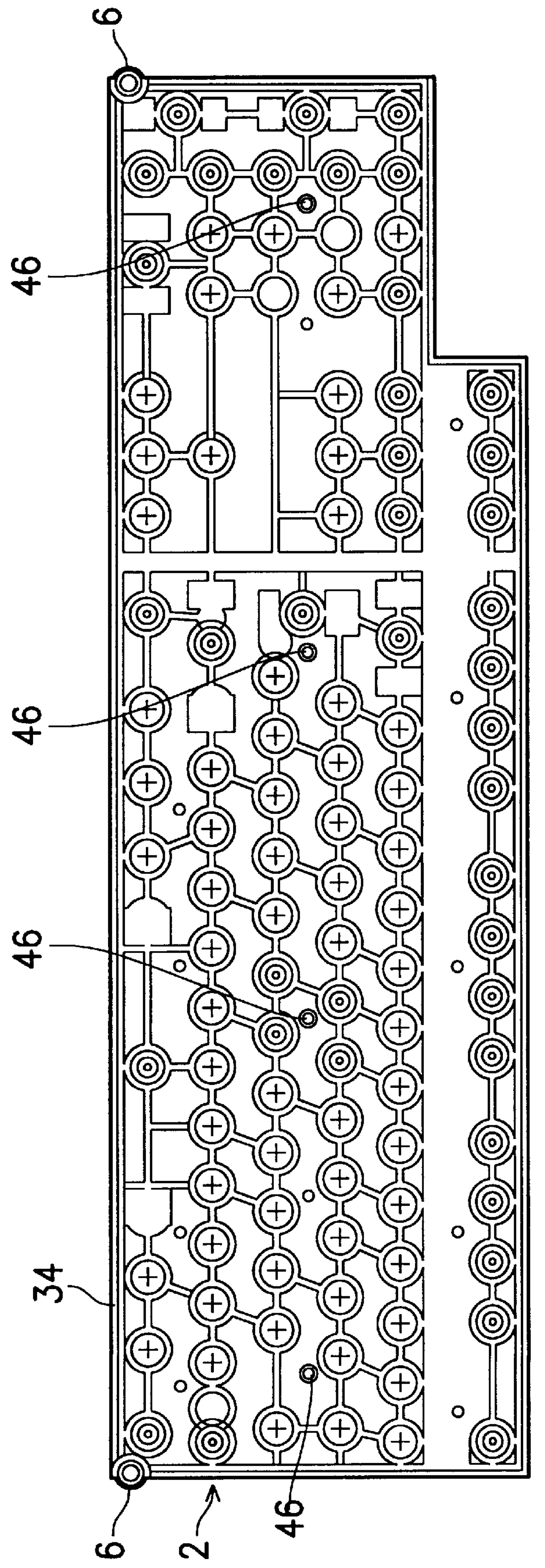
FIG. 4*b* is a bottom view of the water-resistant sheet.

FIG. 4a and FIG. 4b are respectively a top view and a bottom view of the water-resistant sheet 2. The two drawings show that the bolt holes 46 are formed through the water-resistant sheet 2, the circuit membrane 3 and base 5. While the preferred embodiment of the invention has been now made clear, it would be obvious to those skilled in this art that many modifications of structure, arrangement and elements can be made without departing from the principle of the invention. For example, the supporting surface 4 can be a metal strip mounted on the base 5 or is integrally formed with the base 5. The sealing flange 34 can be a separately formed or integrally formed with the water-resistant sheet 2. The upper case 1 can be secured to the base 5 by bolts or by hook means.

What is claimed is:

1. A keyboard assembly comprising:

a base having a supporting surface;

a circuit membrane mounted on the supporting surface of said base, having a plurality of switch elements;

a water-resistant sheet covering said circuit membrane, said water-resistant sheet having a plurality of elastic portions protruded therefrom, each of which are disposed corresponding to each of the switch elements respectively, and said water-resistant sheet having a peripheral edge;

a key frame disposed above said water-resistant sheet, having a plurality of key seats disposed corresponding to the elastic portions;

a plurality of keys, each key being mounted on its respective key seat so that when a key is pressed down, its corresponding elastic portion is depressed to activate its associated switch element;

an upper case mounted on said base, wherein a space for collecting liquid is formed between said key frame and said water-resistant sheet, said space communicating with said plurality of key seats such that liquid entering said key seat flows into said space.

2. The key assembly as claimed in claim 1, further comprising a first sealing flange mounted on said peripheral edge, thereby surrounding said water-resistant sheet.

3. The key assembly as claimed in claim 2, wherein said first sealing flange is integrally formed with said water-resistant sheet along said peripheral edge.

4. The key assembly as claimed in claim 1, wherein said water-resistant sheet is made of an elastomer material.

5. The key assembly as claimed in claim 2, wherein the thickness of said first sealing flange is greater than the thickness of said water-resistant sheet.

6. The key assembly as claimed in claim 1, further comprising a conduit extending downward from the space for draining the liquid collected in the space.

7. The key assembly as claimed in claim 6, further comprising a second sealing flange surrounding said conduit.

8. The key assembly as claimed in claim 7, wherein said second sealing flange is integrally formed with said water-resistant sheet.

9. The key assembly as claimed in claim 1, further comprising a plurality of fastening means for securing said base, said circuit membrane and said water-resistant sheet to said key frame.

10. The key assembly as claimed in claim 9, wherein said fastening means are screw bolts, said screw bolts being respectively received in a plurality of screw holes formed through said base, said circuit membrane and said water-resistant sheet.

11. The key assembly as claimed in claim 10, further comprising a third sealing flange surrounding the screw holes.

12. The key assembly as claimed in claim 1, wherein said upper case includes a protruding portion downwardly disposed along said peripheral edge of said water-resistant sheet in a manner such that when said upper case is secured to said base, said protruding portion is urged to said water-resistant sheet along said peripheral edge to create a tight seal.

13. The key assembly as claimed in claim 1, wherein said key frame is integrally formed with said upper case.

14. The key assembly as claimed in claim 1, wherein said base is integrally formed with said supporting surface.

15. A keyboard assembly comprising:

a base having a supporting surface;

a circuit membrane mounted on the supporting surface of said base, having a plurality of switch elements;

a water-resistant sheet covering said circuit membrane, said water-resistant sheet having a plurality of elastic portions protruded therefrom, each of which are disposed corresponding to each of the switch elements respectively, and said water-resistant sheet having a peripheral edge;

a key frame disposed above said water-resistant sheet, having a plurality of key seats disposed corresponding to the elastic portions;

a plurality of keys, each key being mounted on its respective key seat so that when a key is pressed down, its corresponding elastic portion is depressed to activate its associated switch element;

an upper case mounted on said base, wherein a space for collecting liquid is formed between said key frame and said water-resistant sheet, said space communicating with said plurality of key seats such that liquid entering said key seat flows into said space;

a first sealing flange mounted on said peripheral edge, thereby surrounding said water-resistant sheet.

16. The key assembly as claimed in claim 15, wherein said first sealing flange is integrally formed with said water-resistant sheet along said peripheral edge.

17. The key assembly as claimed in claim 15, wherein the thickness of said first sealing flange is greater than the thickness of said water-resistant sheet.

18. A keyboard assembly comprising:

a base having a supporting surface;

a circuit membrane mounted on the supporting surface of said base, having a plurality of switch elements;

a water-resistant sheet covering said circuit membrane, said water-resistant sheet having a plurality of elastic portions protruded therefrom, each of which are disposed corresponding to each of the switch elements respectively, and said water-resistant sheet having a peripheral edge;

a key frame disposed above said water-resistant sheet, having a plurality of key seats disposed corresponding to the elastic portions;

a plurality of keys, each key being mounted on its respective key seat so that when a key is pressed down, its corresponding elastic portion is depressed to activate its associated switch element;

an upper case mounted on said base, wherein a space for collecting liquid is formed between said key frame and said water-resistant sheet, said space communicating with said plurality of key seats such that liquid entering said key seat flows into said space;

a conduit extending downward from the space for draining the liquid collected in the space;

a second sealing flange surrounding said conduit, said second sealing flange being integrally formed with said water-resistant sheet.

* * * * *